(12) United States Patent
Tsuchiyama et al.

(10) Patent No.: US 11,617,265 B1
(45) Date of Patent: Mar. 28, 2023

(54) ELECTRONIC DEVICE

(71) Applicant: RENESAS ELECTRONICS CORPORATION, Tokyo (JP)

(72) Inventors: Kazuaki Tsuchiyama, Tokyo (JP); Tatsuaki Tsukuda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/519,675

(22) Filed: Nov. 5, 2021

(51) Int. Cl.
*H05K 1/11* (2006.01)
*H05K 1/14* (2006.01)
*H01L 23/538* (2006.01)
*H01L 25/065* (2023.01)

(52) U.S. Cl.
CPC .......... *H05K 1/118* (2013.01); *H01L 23/5384* (2013.01); *H01L 25/0655* (2013.01); *H05K 1/147* (2013.01)

(58) Field of Classification Search
CPC ........ H05K 1/118; H05K 1/147; H05K 1/025; H05K 1/0251; H05K 1/0253; H05K 1/189; H05K 2201/09236; H05K 2201/09445; H05K 2201/0776; H05K 2201/09672; H05K 2201/058; H05K 2201/09145; H05K 2201/09481; H01L 23/5384; H01L 25/0655; H01P 3/006; H01P 5/028; H01P 1/047
See application file for complete search history.

(56) References Cited

U.S. PATENT DOCUMENTS

| 9,502,745 | B2 * | 11/2016 | Hirayama | ............... H01P 5/028 |
| 10,809,470 | B2 | 10/2020 | Tsuchiyama et al. | |
| 10,886,695 | B2 | 1/2021 | Tsuchiyama et al. | |
| 2009/0029570 | A1 * | 1/2009 | Ikeuchi | .................. H05K 1/147 |
| | | | | 439/67 |

FOREIGN PATENT DOCUMENTS

| JP | 2019-212837 A | 12/2019 |
| JP | 2020-043251 A | 3/2020 |

* cited by examiner

*Primary Examiner* — Roshn K Varghese
(74) *Attorney, Agent, or Firm* — McDermott Will & Emery LLP (57) ABSTRACT

A width of each of a first signal terminal and a reference potential terminal formed in a first connection region of a core insulating layer constituting a flexible substrate is larger than a width of each of a first backside signal terminal and a backside reference potential terminal formed in a second connection region of the core insulating layer. In addition, a first separation distance between the first signal terminal and the reference potential terminal arranged adjacent to the first signal terminal is smaller than a second separation distance between the first backside signal terminal and the backside reference potential terminal arranged adjacent to the first backside signal terminal. An insulating film formed on a first surface of the core insulating layer at a position overlapping each of the first connection region and the second connection region covers the first connection region such that the second connection region is exposed.

11 Claims, 9 Drawing Sheets

ELECTRONIC DEVICE

BACKGROUND

The present invention relates to an electronic device.

There is an electronic device that transmits an electrical signal between a flexible substrate and a PCB (Printed Circuit Board) substrate electrically connected to each other. For example, Japanese Unexamined Patent Application No. 2019-212837 and Japanese Unexamined Patent Application No. 2020-43251 each disclose an optical transceiver that transmits an electrical signal between a flexible substrate and a PCB substrate.

SUMMARY

In a case where signal transmission is performed, signal transmission efficiency can be improved by matching a characteristic impedance of a signal transmission path to a design value. In a case where signal transmission is performed between the flexible substrate and the PCB substrate, since a wiring structure of the signal transmission path in a periphery of a connection portion between substrates differs from other portions, deviation between the characteristic impedance of the portion and the design value tends to become large.

On the other hand, in a case where an electrical test of an electronic device having a structure that connects the flexible substrate and the PCB substrate is conducted, it is preferable that the device comprises a structure that allows easy connection between a flexible substrate-side terminal and a PCB substrate-side terminal in a removable manner.

From the viewpoint of improving performance of the electronic device, it is desirable for the device to comprise, for example, a structure in which a degree of deviation in the characteristic impedance for the connection portion between the flexible substrate and the PCB substrate is reduced, and in which the electrical test can be easily performed.

Other problems and novel features will be apparent from the description in the present specification and accompanying drawings.

The electronic device according to one embodiment comprises a first wiring substrate having a flexibility, and a second wiring substrate more rigid than the first wiring substrate and electrically connected to the first wiring substrate. The first wiring substrate includes a core insulating layer having a first surface and a second surface opposite the first surface, the first surface having a first connection region facing the second wiring substrate, and the second surface having a second connection region overlapping the first connection region. The first wiring substrate further includes a plurality of first wirings formed on the first surface and extending in a first direction, a second wiring formed on the second surface and extending in the first direction, a plurality of first terminals formed in the first connection region and electrically connected to the plurality of first wirings or the second wiring, a plurality of second terminals formed in the second connection region and electrically connected to the plurality of first wirings or the second wiring, and an insulating film formed on the first surface of the core insulating layer at a position overlapping each of the first connection region and the second connection region. The plurality of first wirings includes a first signal wiring to which an electrical signal is transmitted, and a reference potential wiring arranged adjacent to the first signal wiring and to which a reference potential is supplied. A reference potential is supplied to the second wiring. The plurality of first terminals includes a first signal terminal electrically connected to the first signal wiring, and a reference potential terminal arranged adjacent to the first signal terminal and electrically connected to each of the reference potential wiring and the second wiring. The plurality of second terminals includes a first backside signal terminal electrically connected to the first signal terminal, and a backside reference potential terminal arranged adjacent to the first backside signal terminal and electrically connected to the reference potential terminal. The second wiring overlaps the first signal wiring. A width of the first signal terminal is larger than a width of the first backside signal terminal, and a width of the reference potential terminal is larger than a width of the backside reference potential terminal. A first separation distance between the first signal terminal and the reference potential terminal is smaller than a second separation distance between the first backside signal terminal and the backside reference potential terminal. The insulating film covers the first connection region such that the second connection region is exposed. The insulating film covering the first connection region covers a peripheral portion of each of the first terminals such that a joint portion of each of the first terminals is exposed. In a first opening formed in the insulating film, the first signal terminal is electrically connected to the second wiring substrate via a first conductive joint material. In a second opening formed in the insulating film, the reference potential terminal is electrically connected to the second wiring substrate via a second conductive joint material electrically separated from the first conductive joint material.

An electronic device according to another embodiment comprises a first wiring substrate having a flexibility, and a second wiring substrate more rigid than the first wiring substrate and electrically connected to the first wiring substrate. The first wiring substrate includes a core insulating layer having a first surface and a second surface opposite the first surface, the first surface having a first connection region facing the second wiring substrate, and the second surface having a second connection region overlapping the first connection region. The first wiring substrate further includes a plurality of first wirings formed on the first surface and extending in a first direction, a second wiring formed on the second surface and extending in the first direction, a plurality of first terminals formed in the first connection region and electrically connected to the plurality of first wirings or the second wiring, a plurality of second terminals formed in the second connection region and electrically connected to the plurality of first wirings or the second wiring, and an insulating film formed on the first surface of the core insulating layer at a position overlapping each of the first connection region and the second connection region. The plurality of first wirings includes a first signal wiring to which an electrical signal is transmitted, and a second signal wiring arranged adjacent to the first signal terminal and in which an electrical signal that differs from the electrical signal flowing in the first signal terminal flows. A reference potential is supplied to the second wiring. The plurality of first terminals includes a first signal terminal electrically connected to the first signal wiring, and a second signal terminal arranged adjacent to the first signal terminal and electrically connected to the second signal wiring. The plurality of second terminals includes a first backside signal terminal electrically connected to the first signal terminal, and a second backside signal terminal arranged adjacent to the first backside signal terminal and electrically connected to the second signal terminal. The second wiring overlaps each of the first signal wiring and the second signal wiring.

A width of the first signal terminal is larger than a width of the first backside signal terminal, and a width of the second signal terminal is larger than a width of the second backside signal terminal. A first separation distance between the first signal terminal and the second signal terminal is smaller than a second separation distance between the first backside signal terminal and the second backside signal terminal. The insulating film covers the first connection region such that the second connection region is exposed. The insulating film covering the first connection region is formed in the first connection region such that a peripheral portion of each of the first terminals is covered and such that a joint portion of each of the first terminals is exposed. In a first opening formed in the insulating film, the first signal terminal is electrically connected to the second wiring substrate via a first conductive joint material. In a second opening formed in the insulating film, the second signal terminal is electrically connected to the second wiring substrate via a second conductive joint material electrically separated from the first conductive joint material.

DETAILED DESCRIPTION

Explanation of Description Format, Basic Terminology and Usage in Present Application In the present application, an embodiment will be described in a plurality of sections or the like when necessary for the sake of convenience. However, these sections or the like are not independent or separate from each other unless otherwise clearly specified, and one portion of an example corresponds to another detailed portion, another portion, an entire modification or the like, regardless of the order of the description. In addition, redundant descriptions of identical portions will be omitted in principle. Further, each of the components in the embodiment is not always indispensable unless otherwise clearly specified, it is theoretically limited to a given number or it is obvious from the context that the component is indispensable.

Likewise, in the description of the embodiment and the like, the wording such as "X made of A" used in association with a material, a composition or the like does not exclude a component that contains elements other than A unless otherwise clearly specified or it is obvious from the context that the material, the composition or the like only contains A. For example, "X made of A" used for a component means "X containing A as a main component" or the like. It is needless to say that, for example, a "silicon member" or the like is not limited to a member made of pure silicon but includes a member made of a SiGe (silicon-germanium) alloy or a multicomponent alloy containing silicon as a main component, and a member containing other additives and the like. In addition, a gold plating, a Cu layer, a nickel plating or the like is not limited to a member made of a pure component, and includes a member respectively containing gold, Cu, nickel or the like as a main component unless otherwise clearly specified.

Further, when referring to a specific numerical value or a quantity, the numerical value may be less than or greater than the specific numerical value unless otherwise clearly specified, it is theoretically limited to the specified value or it is obvious from the context that the value may not be less than or greater than the specified value.

In addition, in all of the drawings used to describe the embodiments, the same or identical portions are denoted by the same or similar symbols or reference signs, and redundant descriptions of the components are omitted in principle.

Further, in the accompanying drawings, hatched lines and the like are occasionally omitted even if the drawing is a cross section if the hatched lines make the drawings complicated or a difference between a member and a void is obvious. In this context, contour lines of a background are occasionally omitted even for a closed circle in plan view if it is obvious from the descriptions or the like. Furthermore, hatched lines or stippled dots are occasionally added even if the drawing is not a cross section in order to clarify that the portion is not a void or in order to clarify a boundary of a region.

<Electronic Device>

Figure 1:
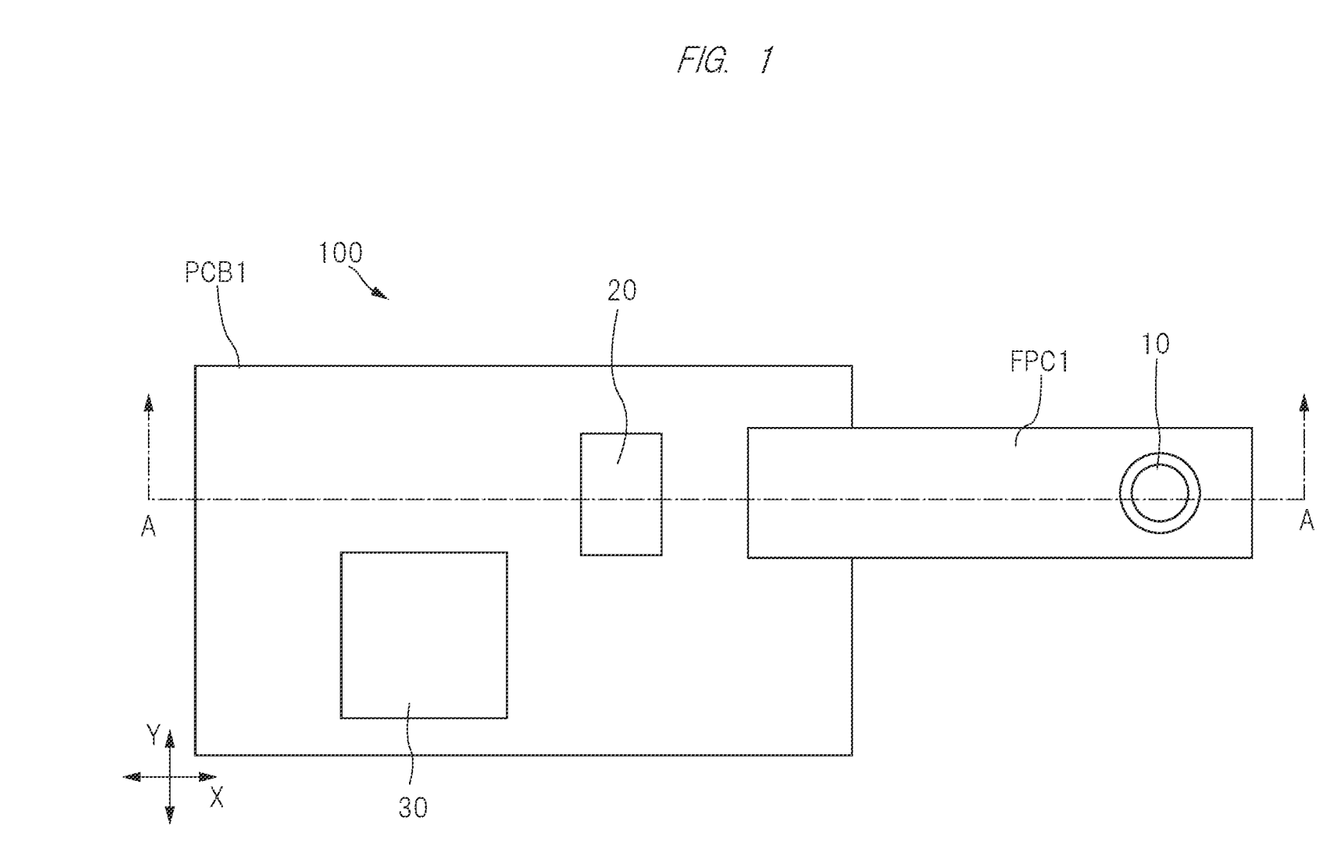
FIG. 1 is a plan view showing a configuration example of an optical transceiver which is an electronic device of one embodiment.
Figure 2:
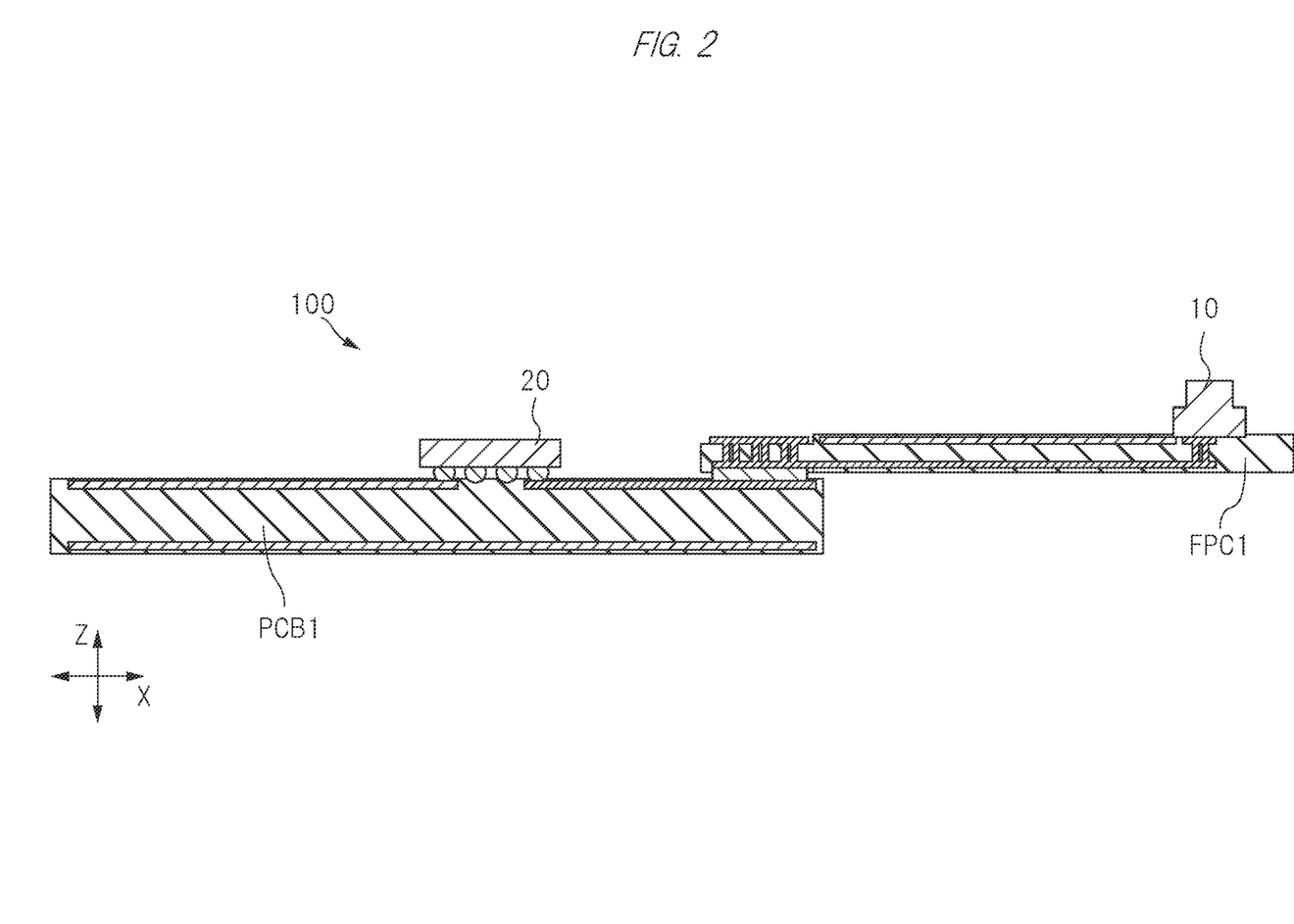
FIG. 2 is a cross-sectional view taken along a line A-A of FIG. 1.

In the present embodiment, an optical transceiver will be described as an example of an electronic device having a structure in which a flexible substrate and a PCB substrate are electrically connected to each other. The optical transceiver is an electronic device comprising a transmitting function configured to convert an electrical signal into an optical signal and to transmit the optical signal to an external device, and a receiving function configured to receive the optical signal from the external device and to convert the optical signal into an electrical signal. FIG. 1 is a plan view showing a configuration example of the optical transceiver which is the electronic device of the present embodiment. FIG. 2 is a cross-sectional view taken along a line A-A of FIG. 1.

As shown in FIGS. 1 and 2, an optical transceiver (electronic device) 100 has a substrate (flexible substrate) FPC1 which is a wiring substrate having a flexibility, and a substrate (PCB substrate) PCB1 which is a wiring substrate more rigid than the substrate FPC1 and joined (that is, electrically connected) to the substrate FPC1. In addition, the optical transceiver 100 has a semiconductor device 10 mounted on the substrate FPC1, and a semiconductor device 20 mounted on the substrate PCB1. The semiconductor device 10 is a photoelectric conversion device comprising a transmitting portion configured to convert an electrical signal into an optical signal, and a receiving portion configured to convert the optical signal into an electrical signal. The semiconductor device 20 comprises a drive circuit configured to drive an optical element (such as a semiconductor laser) of the semiconductor device 10. In addition, the optical transceiver 100 has a semiconductor device 30 mounted on the substrate PCB1. The semiconductor device 30 is a semiconductor device that controls signal transmission between the optical transceiver 100 and the external device via the semiconductor device 10 which is the photoelectric conversion device. A data signal outputted from the semiconductor device 30 is transmitted to the semiconductor device 10 via the semiconductor device 20 comprising the drive circuit. An electrical signal is transmitted between the semiconductor device 30 and the semiconductor device 20, and between the semiconductor device 10 and the semiconductor device 20.

For example, in a case where a signal for driving the optical element is transmitted from the semiconductor device 20, the signal outputted from the semiconductor device 20 is transmitted to the semiconductor device 10 as an electrical signal via the substrate PCB1 and the substrate FPC1. The electrical signal is converted into a signal in the semiconductor device 10, and an optical signal is outputted from the optical element (such as the semiconductor laser) of the semiconductor device 10 to the external device. In addition, in a case where the semiconductor device 20 receives a signal, the optical signal transmitted from the external device is received by the optical element (such as a photodiode) of the semiconductor device 10. The optical signal is converted into an electrical signal in the semiconductor device 10, and is transmitted to the semiconductor device 20 via the substrate FPC1 and the substrate PCB1.

In the case of the present embodiment, an electrical signal transmission method between the semiconductor device 10 and the semiconductor device 20 is a modulation method referred to as a pulse amplitude modulation (PAM). As a transmission method other than PAM, there is a method referred to as an NRZ (non-return-to-zero) method. In the NRZ method, one bit is represented by two states (such as a positive voltage level and a zero-volt voltage level) of a signal pulse. In the case of the NRZ method, a frequency of a pulse signal is increased to speed up the signal transmission. As the frequency of the pulse signal is increased, a requirement level for reducing transmission loss, crosstalk noise and the like increases.

In PAM, an amplitude of a signal waveform is classified into multiple types for each symbol. For example, in PAM4, the signal waveform is classified into four types of amplitude levels (hereinafter referred to as 4-level). In the case of PAM4, since four bits can be represented in one cycle, the data rate can be increased even if the signal transmission rate is assumed to be the same. In a case where one-half of the frequency is a Nyquist frequency, for example, it is 28 GHz when the signal transmission is performed at a data rate of 56 Gbps using the NRZ method, whereas it would be 14 GHz when the signal transmission is performed at a data rate of 56 Gbps using PAM4. In other words, PAM4 can provide twice the transmission bandwidth with the same channel bandwidth relative to the NRZ method.

Note that, in the case of PAM4, it is necessary to clearly provide an eye-pattern opening (eye opening) corresponding to the 4-level amplitude. In addition, since an amplitude of the eye opening corresponding to the 4-level amplitude is smaller than that of an eye opening corresponding to a 2-level amplitude, a margin of a signal-noise ratio (SNR) is small. For example, if the signal amplitude is one-third of that of the NRZ method, the SNR in the case of PAM4 is 9.5 dB (decibels) lower relative to the case of the NRZ method. Thus, in the case of the PAM method, the requirement level for reducing crosstalk noise, jitter and the like is even stricter than in the case of the NRZ method. Since it is necessary to reduce a signal reflection that causes intersymbol interference or the like, an impedance design of the signal transmission path is important.

In the electrical signal transmission path from the semiconductor device 20 to the semiconductor device 10, since the wiring structure constituting the transmission path changes at the connection portion electrically connecting the substrate PCB1 and the substrate FPC1, the characteristic impedance tends to fluctuate (decrease or increase) from the design value. Studies by the inventors of the present application have found that, in the connection portion between the substrate FPC1 and the substrate PCB1, the characteristic impedance tends to be lower than the design value (such as 50Ω) on the substrate PCB1 side, and the characteristic impedance tends to be higher than the design value on the substrate FPC1 side. In a wiring design that considers the characteristic impedance, it is relatively more difficult to provide a design that reduces the characteristic impedance than to provide a design that increases the characteristic impedance. Therefore, in the connection portion between the substrate PCB1 and the substrate FPC1, the structure of the connection portion on the substrate FPC1 side is particularly important.

In addition, in a case where a manufacturing process of the electronic device 100 is considered, it is preferable to test the electrical characteristics of the component (such as the semiconductor device 10) mounted on each of the substrate FPC1 and the substrate FPC1 before the substrate PCB1 and the substrate FPC1 are joined to each other. By conducting the electrical test before completion of the electronic device 100, the substrate FPC1 with defective electrical characteristics can be eliminated or repaired before completion. It is preferable that the electrical test is performed by electrically connecting, for example, a test board for the electrical test and the substrate FPC1 in an easily removable manner.

Based on the above, the inventors of the present application has studied a structure capable of achieving both a reduction of the deviation in the characteristic impedance for the connection portion between the substrate FPC1 and the substrate PCB1, and high removability when the electrical test is performed. Hereinafter, a detailed structure of the connection portion between the substrate PCB1 and the substrate FPC1 shown in FIG. 1 will be described with reference to the drawings.

<Detailed Structure of Connection Portion>

Figure 3:
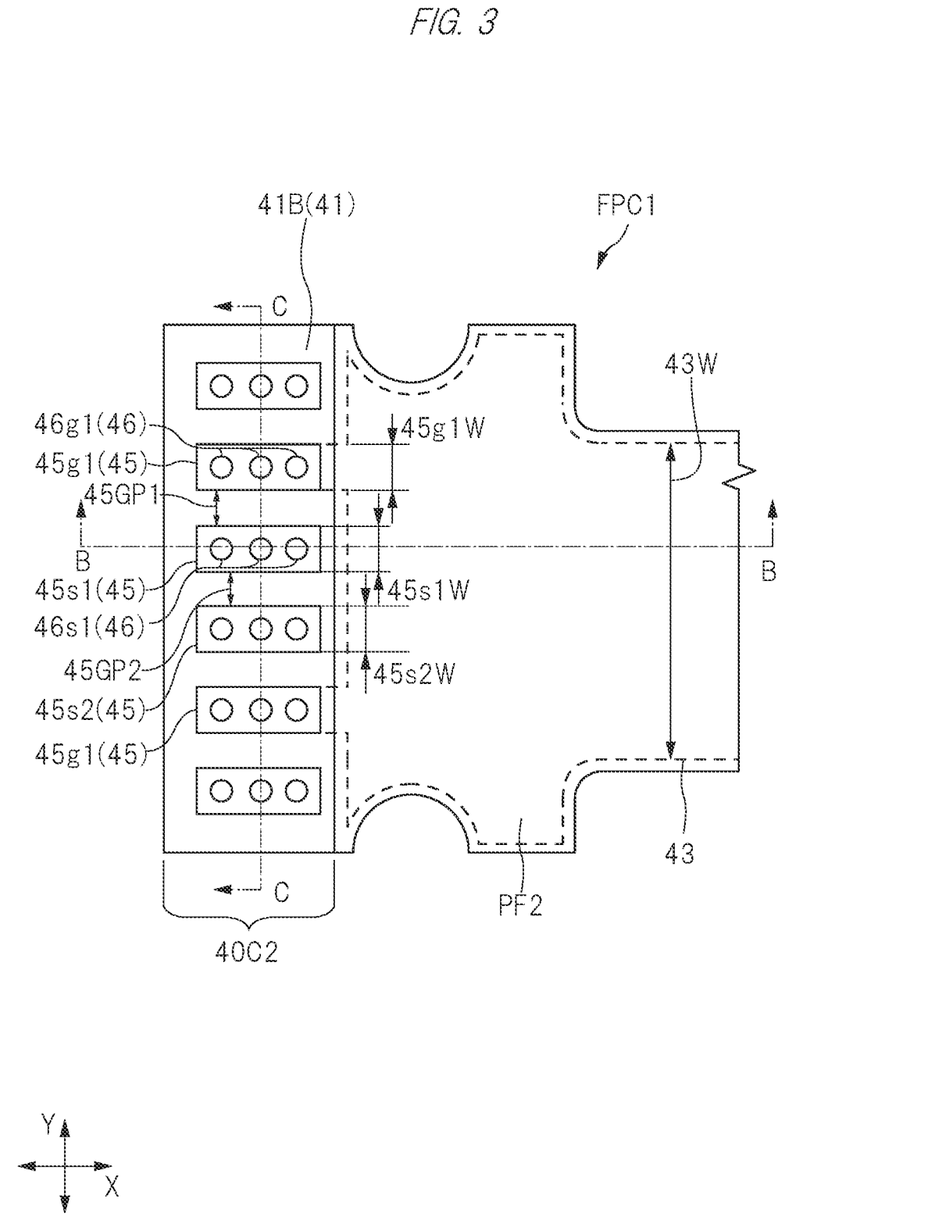
FIG. 3 is an enlarged plan view of a connection portion of a flexible substrate shown in FIG. 1 when viewed from above the flexible substrate.
Figure 4:
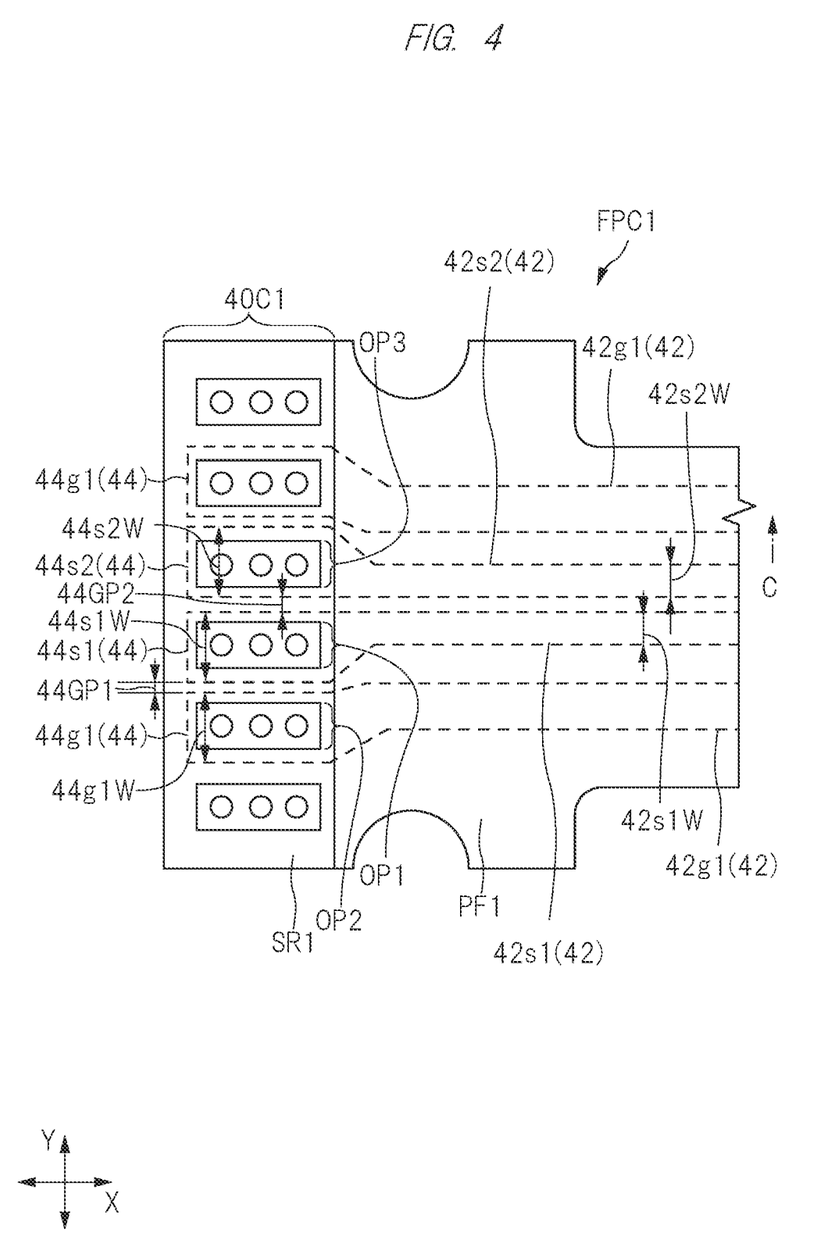
FIG. 4 is an enlarged plan view of the connection portion of the flexible substrate shown in FIG. 3 when viewed from a PCB substrate side.
Figure 5:
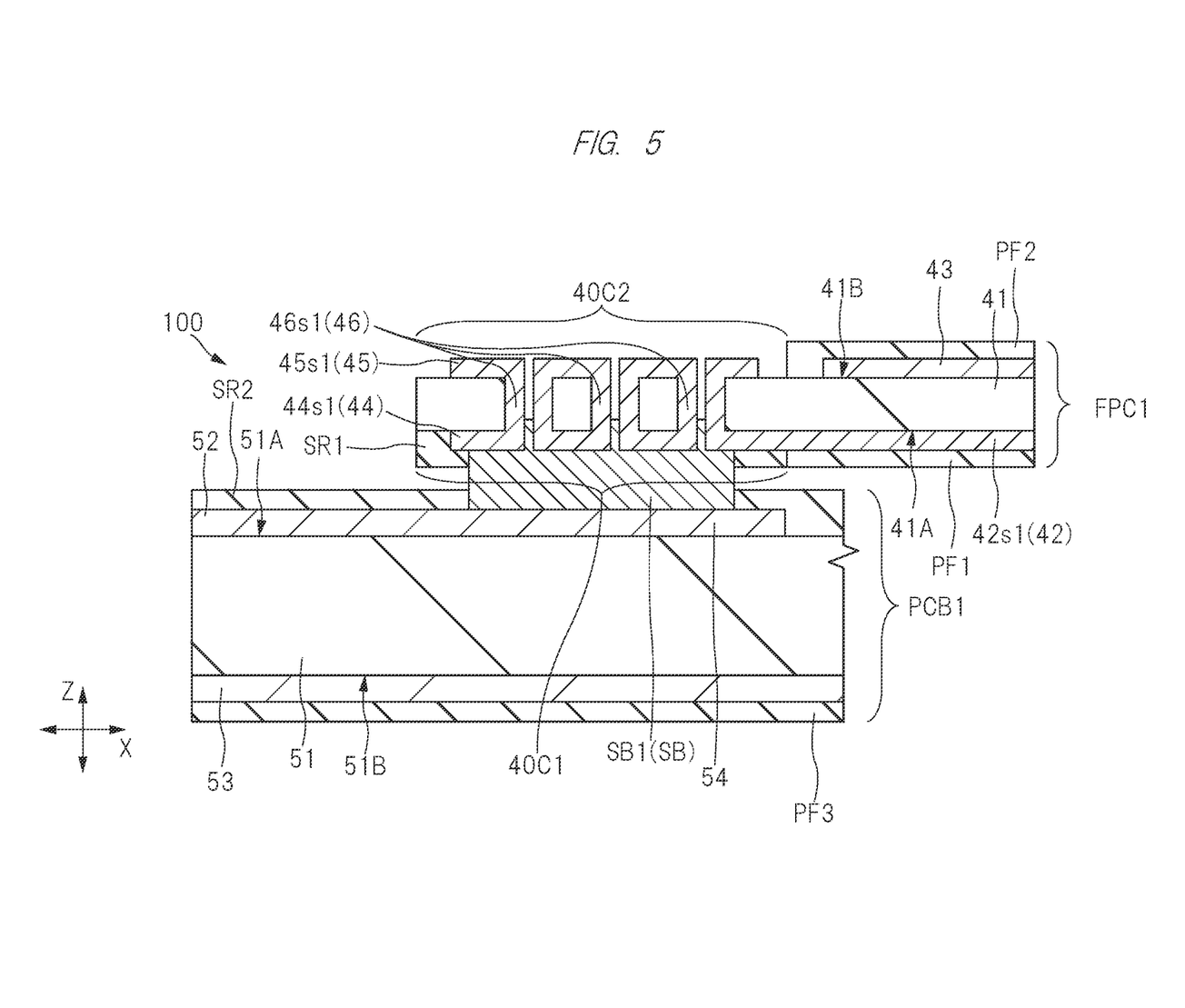
FIG. 5 is an enlarged cross-sectional view taken along a line B-B of FIG. 3.
Figure 6:
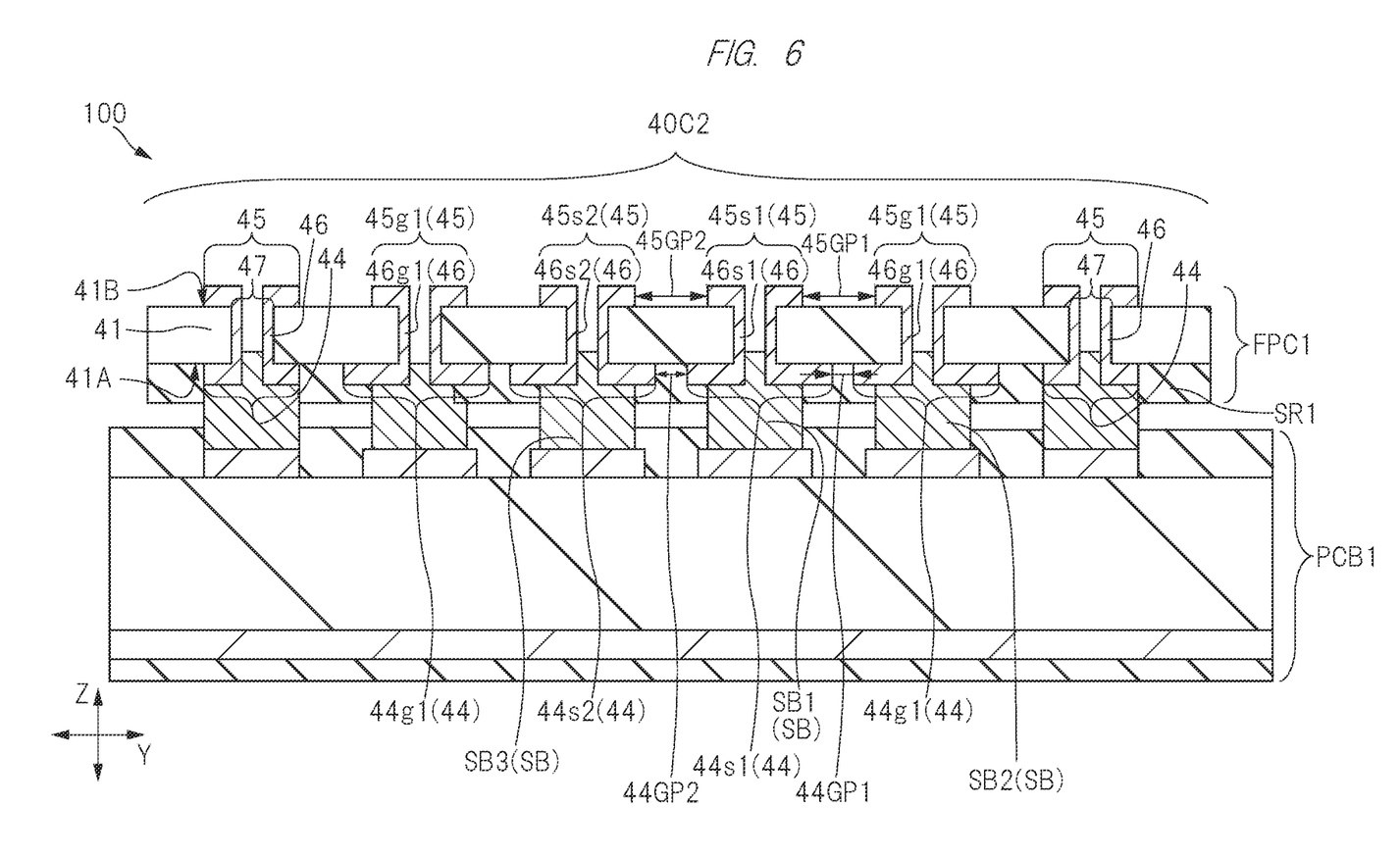
FIG. 6 is an enlarged cross-sectional view taken along a line C-C of FIG. 3.
Figure 7:
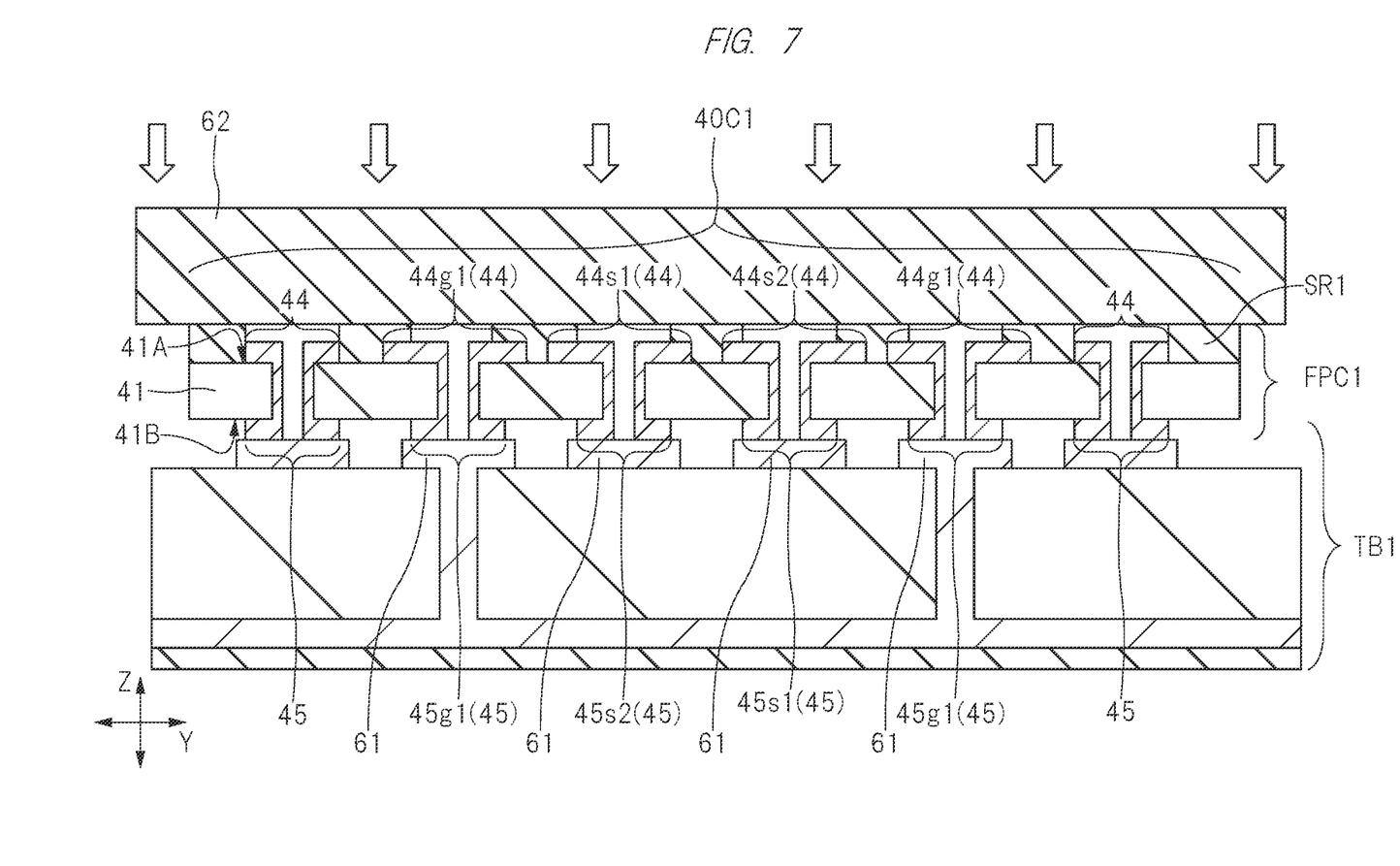
FIG. 7 is a cross-sectional view schematically showing a state where the flexible substrate shown in FIG. 6 is flipped over and is connected to a test board.

FIG. 3 is an enlarged plan view of the connection portion of the flexible substrate shown in FIG. 1 when viewed from above the flexible substrate. FIG. 4 is an enlarged plan view of the connection portion of the flexible substrate shown in FIG. 3 when viewed from the PCB substrate side. FIG. 5 is an enlarged cross-sectional view taken along a line B-B of FIG. 3. FIG. 6 is an enlarged cross-sectional view taken along a line C-C of FIG. 3. FIG. 7 is a cross-sectional view schematically showing a state where the flexible substrate shown in FIG. 6 is flipped over and is connected to the test board.

A terminal 44 and a wiring 42 shown in FIG. 4 are conductor patterns formed on a surface 41A (see FIG. 5) of a core insulating layer 41 (see FIG. 5) composing the substrate FPC1. Here, as shown in FIG. 5, the surface 41A of the core insulating layer 41 has a connection region 40C1 facing the substrate PCB1, and the surface 41B of the core insulating layer 41 has a connection region 40C2 overlapping the connection region 40C1. Although the terminal 44 and the wiring 42 are formed so as to be integral with each other, they are distinguished and defined herein as follows.

That is, among the conductor patterns formed on the surface 41A of the core insulating layer 41 and electrically connected to the substrate PCB1, a portion located at the connection region 40C1 in which a solder resist film SR1 is formed is the terminal 44. On the other hand, among the conductor patterns formed on the surface 41A of the core insulating layer 41 and electrically connected to the substrate PCB1, a portion located at a position other than the connection region 40C1 is the wiring 42. A plurality of the wirings 42 is covered by a protective insulating film (plastic film, insulating film, protective film) PF1.

In addition, a terminal 45 and a wiring 43 shown in FIG. 3 are conductor patterns formed on a surface 41B (see FIG. 5) of the core insulating layer 41 (see FIG. 5) of the substrate FPC1. Although the terminal 45 and the wiring 43 are formed so as to be integral with each other, they are distinguished and defined herein as follows. That is, among the conductor patterns formed on the surface 41B of the core insulating layer 41 and electrically connected to the substrate PCB1, a portion formed in the connection region 40C2 opposite the connection region 40C1 (see FIG. 4) and exposed from a protective insulating film (plastic film, insulating film, protective film) PF2 is the terminal 45. On the other hand, among the conductor patterns formed on the surface 41B of the core insulating layer 41 and electrically connected to the substrate PCB1, the portion located at a position other than the connection region 40C2 is the wiring 43. The wiring 43 is covered by the protective insulating film PF2.

The substrate FPC1 has the core insulating layer 41 (see FIG. 5) having the surface 41A (see FIG. 5) and the surface 41B (see FIG. 5) opposite the surface 41A, the plurality of wirings 42 formed on the surface 41A, and the wiring 43 formed on the surface 41B. In addition, the substrate FPC1 has a plurality of the terminals 44 arranged on a portion of the surface 41A, formed in the connection region 40C1 (see FIG. 4) facing the substrate PCB1, and electrically connected to the plurality of wirings 42 or the wiring 43. As shown in FIG. 6, the substrate FPC1 has a solder resist film (insulating film) SR1 formed on the surface 41A of the core insulating layer 41 at a position overlapping each of the connection regions 40C1 and 40C2 such that a portion (covering portion, peripheral portion) of each of the terminals 44 is covered and such that a portion (joint portion) of each of the terminals 44 is exposed. Note that the joint portion of each of the terminals 44 exposed from the solder resist film SR1 is a portion that comes into contact with a conductive joint material SB described below. In addition, the substrate FPC1 has a plurality of the terminals 45 arranged on a portion of the surface 41B, formed in the connection region 40C2 (see FIG. 3) located at a position overlapping the connection region 40C1, and electrically connected to the plurality of wirings 42 and the wiring 43. As shown in FIGS. 3 to 5, some of the plurality of terminals 44 (reference potential terminals 44g1 described below) formed on the surface 41A are electrically connected to not only some of the plurality of wirings 42 (reference potential wirings 42g1 described below) formed on the surface 41A, but also the wiring 43 formed on the surface 41B via the terminal 45. On the other hand, as shown in FIGS. 3 to 5, some of the plurality of terminals 45 (reference potential terminals 45g1 described below) formed on the surface 41B are electrically connected to not only the wiring 43 formed on the surface 41B, but also the wiring 42 formed on the surface 41A via the terminal 44.

As shown in FIG. 4, the plurality of terminals 44 includes a signal terminal 44s1 to which an electrical signal is transmitted, and a reference potential terminal 44g1 electrically connected to the wiring 43 to which a reference potential is supplied. As shown in FIG. 5, in a cross-sectional view, the wiring 43 overlaps a signal wiring 42s1 electrically connected to the signal terminal 44s1 among the plurality of wirings 42, and is arranged along an extension direction of the signal wiring 42s1. The signal terminal 44s1 and the signal wiring 42s1 are included in a transmission path electrically connecting the semiconductor device 10 and the semiconductor device 20 shown in FIG. 2 to each other. In addition, as shown in FIG. 6, the plurality of terminals 45 and the plurality of terminals 44 are respectively and electrically connected via a plurality of via wirings 46. The plurality of terminals 45 includes a signal terminal (backside signal terminal) 45s1 formed at a position overlapping the signal terminal 44s1 and electrically connected to the signal terminal 44s1 via a via wiring 46s1, and a reference potential terminal (backside reference potential terminal) 45g1 formed at a position overlapping the reference potential terminal 44g1 and electrically connected to the signal terminal 44g1 via a via wiring 46g1. As shown in FIG. 3, the reference potential terminal (backside reference potential terminal) 45g1 is also electrically connected to the wiring 43. In addition, in the example shown in FIG. 6, the plurality of terminals 45 includes a signal terminal (backside signal terminal) 45s2 formed at a position overlapping a signal terminal 44s2 and electrically connected to the signal terminal 44s2 via a via wiring 46s2.

As can be seen by comparing FIGS. 3 and 4, a width 44s1W (see FIG. 4) of the signal terminal 44s1 (see FIG. 4) is larger than a width 45s1W (see FIG. 3) of the signal terminal 45s1 (see FIG. 3), and a width 44g1W (see FIG. 4) of the reference potential terminal 44g1 (see FIG. 4) is larger than a width 45g1W of the reference potential terminal 45g1 (see FIG. 3). In addition, a separation distance 44GP1 between the signal terminal 44s1 and the reference potential terminal 44g1 arranged adjacent to the signal terminal 44s1 is smaller than a separation distance 45GP1 between the signal terminal 45s1 and the reference potential terminal 45g1 arranged adjacent to the signal terminal 45s1.

A dimension example of each of the widths 45s1W, 45s2W and 45g1W shown in FIG. 3 is 0.45 mm. In addition, a dimension example of each of the separation distances 45GP1 and 45GP2 is 0.35 mm. In addition, a dimension example of each of the widths 44s1W, 44s2W and 44g1W shown in FIG. 4 is 0.65 mm. In addition, a dimension example of the separation distance 44GP1 is 0.1 mm, and a dimension example of the separation distance 45GP2 is 0.15 mm. Note that a dimension example of each of the widths 42s1W and 42s2W shown in FIG. 4 is 0.35 mm. However, there may be a case where values of the widths 42s1W and 42s2W are determined according to the characteristic impedance of the signal transmission path, and as a modification example, the widths 44s1W and 44s2W may, for example, have the same value.

In addition, as shown in FIG. 3, the plurality of terminals 45 is not covered by the solder resist film SR1 (see FIG. 4). As shown in FIG. 6, in an opening OP1 (see FIG. 4) formed in the solder resist film SR1, the signal terminal 44s1 is electrically connected to the substrate PCB1 via a conductive joint material SB1. In an opening OP2 (see FIG. 4) formed in the solder resist film SR1, the reference potential terminal 44g1 is electrically connected to the substrate PCB1 via a conductive joint material SB2 electrically separated from the conductive joint material SB1.

As described above, studies by the inventors of the present application have found that, in the connection portion between the substrate FPC1 and the substrate PCB1, the characteristic impedance tends to be higher than the design value (such as 50Ω) on the substrate FPC1 side. The plurality of wirings 42 shown in FIG. 4 includes the signal wiring 42$s$1 connected to the signal terminal 44$s$1 and to which an electrical signal is transmitted, and a reference potential wiring 42$g$1 electrically connected to the wiring 43 via the reference potential terminal 44$g$1 and to which a reference potential is supplied. The signal wiring 42$s$1 is arranged between two reference potential wirings 42$g$1 extending in an X direction, and extends along the X direction. In addition, as shown in FIG. 5 and in a cross-sectional view, the signal wiring 42$s$1 overlaps the wiring 43 to which a reference potential is supplied. The wiring 43 extends in the X direction while overlapping the signal wiring 42$s$1. The reference potential wiring 42$g$1 and the wiring 43 act as an electromagnetic shield that prevents electromagnetic waves caused by a current flowing in the signal wiring 42$s$1 from propagating to the surroundings. In addition, the wiring 43 acts as a return path for an electrical signal flowing in the signal wiring 42$s$1. A wiring structure of the signal wiring 42$s$1 shown in FIGS. 4 and 5 is referred to as a microstripline structure. A width 43W of the wiring 43 shown in FIG. 3 is larger than a width of each of the wirings 42 (such as the width 42$s$1W of the signal wiring 42$s$1 and the width 42$s$2W of a signal wiring 42$s$2) shown in FIG. 4. This wider width 43W of the wiring 43 acting as an electromagnetic shield improves an electromagnetic shielding effect.

As shown in FIG. 5, since the terminal 45 is formed in the connection region 40C2, the wiring 43 is not formed in the connection region 40C2 and terminates before the connection region 40C2. Therefore, the signal terminal 44$s$1 arranged in the connection region 40C1 does not have the microstripline structure but has a coplanar structure. Thus, in a case where the wiring structures differ between the connection region 40C1 and the region in which the wiring 42 is arranged, the characteristic impedance of the signal transmission path tends to change. Therefore, in the present embodiment, a method of increasing a cross-sectional area of the transmission path is adopted as a method of reducing the characteristic impedance for the substrate FPC1.

As shown in FIG. 4, in the case of the substrate FPC1, each of the width 44$s$1W of the signal terminal 44$s$1 and the width 44$g$1W of the reference potential terminal 44$g$1 is increased to reduce the characteristic impedance of the signal transmission path. The width of the terminal 44 is defined as a length of the terminal 44 in a direction (Y direction in FIG. 4) orthogonal to an extension direction (X direction in FIG. 4) of the terminal 44. For example, the width 44$s$1W is defined as a length of the signal terminal 44$s$1 in a direction orthogonal to an extension direction of the signal terminal 44$s$1. Likewise, the width 44$g$1W is defined as a length of the reference potential terminal 44$g$1 in a direction orthogonal to an extension direction of the reference potential terminal 44$g$1.

Here, in consideration of the versatility of the substrate FPC1, even in a case where the width of the terminal 44 is increased, an area of the connection region 40C1 and the number of terminals 44 arranged in the connection region 40C1 cannot be changed. Therefore, in order to increase the width of each of the terminals 44, it is necessary to reduce a distance between adjacent terminals. For example, in order to increase the widths 44$s$1W and 44$g$1W, it is necessary to reduce the separation distance 44GP1 between the signal terminal 44$s$1 and the reference potential terminal 44$g$1.

In a case where the separation distance between each of the terminals 44 is reduced, a risk of short-circuiting in adjacent terminals 44 increases. The conductive joint material SB (see FIG. 6) is joined to each of the terminals 44. The conductive joint material is, for example, a solder material. When the solder materials joined to each of the terminals 44 come into contact with each other, short-circuiting can occur in adjacent terminals 44 via the solder materials. Therefore, in the case of the present embodiment, as a measure to prevent short-circuiting, the plurality of terminals 44 is covered by the solder resist film SR1 which is an insulating film. The solder resist film SR1 has a plurality of openings (such as openings OP1 and OP2), and the structure is such that a portion (joint portion) of the terminal 44 is exposed from the solder resist film SR1 via the openings. A peripheral portion (particularly a side surface) which is the covering portion of each of the terminals 44 is covered by the solder resist film SR1. That is, as shown in FIG. 6, for example, the solder resist film SR1 is interposed between two adjacent terminals 44. Such a structure is referred to as an SMD (Solder Mask Defined) structure. In the case of the SMD structure, the portion of the terminal 44 joined to the conductive joint material SB is limited by the solder resist film SR1. Therefore, in a case where the separation distance between adjacent terminals 44 is small, short-circuiting in the conductive joint materials SB arranged adjacent to each other can be suppressed.

On the other hand, as shown in FIG. 7, in a step of performing an electrical test of the substrate FPC1 in a manufacturing process of the electronic device 100 of the present embodiment, each of the terminals 45 is brought into contact with a terminal 61 of a test board TB1 to electrically connect the plurality of terminals 45 and a plurality of the terminals 61 of the test board TB1. In the example shown in FIG. 7, in a state where the plurality of terminals 45 face the test board TB1, the substrate FPC1 is pressed by an insulating pressing member 62 from above the connection region 40C1. Thus, the plurality of terminals 45 can be brought into contact with the terminal 61 of the test board TB1.

Here, the plurality of terminals 44 has the SMD structure as described above. Therefore, even if an attempt is made to bring the plurality of terminals 44 into contact with the terminal 61 of the test board TB1 by a method similar to the method shown in FIG. 7, the solder resist film SR1 blocks the contact between the terminals 44 and 61. The terminals 44 and 61 can be electrically connected by interposing a conductive joint material such as a solder material. However, in this case, it would be difficult to pull off the test board TB1 from the substrate FPC1 after the test is finished.

In the case of the present embodiment, each of the terminals 45 is not covered by the solder resist film SR1 and protrudes from the surface 41B of the core insulating layer 41. Therefore, the plurality of terminals 45 can be easily brought into contact with the plurality of terminals 61 by a method similar to the method shown in FIG. 7. In addition, as shown in FIG. 3, the width 45$s$1W of the signal terminal 45$s$1 and the width 45$g$1W of the reference potential terminal 45$g$1 is smaller than the width 44$s$1W of the signal terminal 44$s$1 and the width 44$g$1W of the reference potential terminal 44$g$1 shown in FIG. 4. Therefore, for example, as shown in FIG. 7, each of the signal terminal 45$s$1 and the reference potential terminal 45$g$1 can be brought into contact with the terminal 61 in a removable manner. In the example shown in FIG. 7, the terminal 61 of the test board TB1 does not have the SMD structure. However, even in a case where the terminal 61 has the SMD structure, the terminal 61 can be brought into contact with the terminal 45 by the method shown in FIG. 7. That is, according to the present embodiment, the terminal 45 can be brought into contact with the terminal 61 regardless of the structure of the terminal 61 of the test board TB1. In addition, in the case of the method shown in FIG. 7, the terminal 45 is brought into contact with the terminal 61 by a simple pressing force from the pressing member 62. Therefore, the terminal 45 can be easily pulled apart from the terminal 61 by removing the pressing member 62.

Note that, as shown in FIG. 6, each of the via wirings 46 is formed by depositing a metal film along a wall surface of a via hole 47 formed so as to penetrate the core insulating layer 41 from one of the surface 41A and the surface 41B to the other of the surface 41A and the surface 41B. Therefore, a through hole (portion of the via hole 47) remains in a center of the via wiring 46 formed in the via hole 47. For example, in a case where a solder material is used as the conductive joint material SB and the amount of the applied solder material is large, the solder material can creep up to the terminal 45 on the surface 41B side via the through hole which is a portion of the via hole 47. Each of the terminals 45 is not covered by the solder resist film SR1. Therefore, in a case where the solder material creeps up to the surface 41B side (that is, the connection region 40C2 side) and the separation distance between the terminals 45 is short, short-circuiting can occur in adjacent terminals 45 via the solder material.

In the case of the present embodiment, the separation distance (such as the separation distance 45GP1) between each of the terminals 45 is larger than the separation distance 44GP1 between the signal terminal 44$s$1 and the reference potential terminal 44$g$1. Therefore, even in a case where the conductive joint material SB which is a solder material goes around to the connection region 40C2 side, short-circuiting in the signal terminal 44$s$1 and the reference potential terminal 44$g$1 via the solder material can be prevented.

As described above, according to the present embodiment, the terminal 45 to be connected to the test board TB1 and the terminal 44 to be connected to the substrate PCB1 (see FIG. 6) actually used are formed opposite to each other, and the terminals 44 and 45 are formed so as to have structures that differ from each other. Therefore, the width 44$s$1W of the signal terminal 44$s$1 can be increased and the characteristic impedance for a terminal portion of the signal transmission path can be reduced. In addition, by using the terminal 45 as a terminal for the electrical test, the test board TB1 for the electrical test and the substrate FPC1 can be electrically connected and tested in an easily removable manner. That is, the electronic device 100 of the present embodiment comprises a structure in which the degree of deviation in the characteristic impedance for the connection portion between the substrate FPC1 and the substrate PCB1 is reduced, and in which the electrical test can be easily performed.

In addition, in the example shown in FIG. 4, the plurality of wirings 42 comprises a signal wiring 42$s$2 arranged adjacent to the signal wiring 42$s$1 and extending in the X direction. An electrical signal that differs from the electrical signal flowing in the signal wiring 42$s$1 flows in the signal wiring 42$s$2. The plurality of terminals 44 includes the signal terminal 44$s$2 in which an electrical signal that differs from the electrical signal flowing in the signal terminal 44$s$1 flows. The signal terminal 44$s$2 is connected to the signal wiring 42$s$2. The signal terminals 44$s$1 and 44$s$2 form, for example, a differential pair. In this case, it is necessary for the signal terminals 44$s$1 and 44$s$2 to be adjacent to each other.

As can be seen by comparing FIGS. 3 and 4, the wiring 43 shown in FIG. 3 overlaps the signal wiring 42$s$2. FIG. 5 is an enlarged cross-sectional view taken along an extension direction of the signal terminal 45$s$1 shown in FIG. 3. However, the cross section taken along the extension direction of the signal terminal 45$s$2 shown in FIG. 3 also has a structure similar to that of FIG. 5. Therefore, the signal terminals 44$s$1 and 45$s$1 shown in FIG. 5 can be replaced with the signal terminals 44$s$2 and 45$s$2. In addition, the signal wiring 42$s$1 shown in FIG. 5 can be replaced with the signal wiring 42$s$2. As shown in FIG. 6, the plurality of terminals 45 include the signal terminal 45$s$2 electrically connected to the signal terminal 44$s$2. The width 44$s$2W of the signal terminal 44$s$2 shown in FIG. 4 is larger than the width 45$s$2W of the signal terminal 45$s$2 shown in FIG. 3. As shown in FIG. 6, a separation distance 44GP2 between the signal terminal 44$s$1 and the signal terminal 44$s$2 is smaller than the separation distance 45GP2 between the signal terminal 45$s$1 and the signal terminal 45$s$2. In an opening OP3 (see FIG. 4) formed in the solder resist film SR1, the signal terminal 44$s$2 is electrically connected to the substrate PCB1 via a conductive joint material SB3 electrically separated from the conductive joint materials SB1 and SB2.

The above-described configuration prevents short-circuiting from occurring in the signal terminal 44$s$1 and the signal terminal 44$s$2 via the conductive joint material SB. In addition, as shown in FIG. 7, when the electrical test of the substrate FPC1 is performed, the terminals 61 of the test board TB1 and the signal terminal 45$s$2 can be securely connected in an easily removable manner.

<Connection Portion of PCB Substrate>

Figure 8:
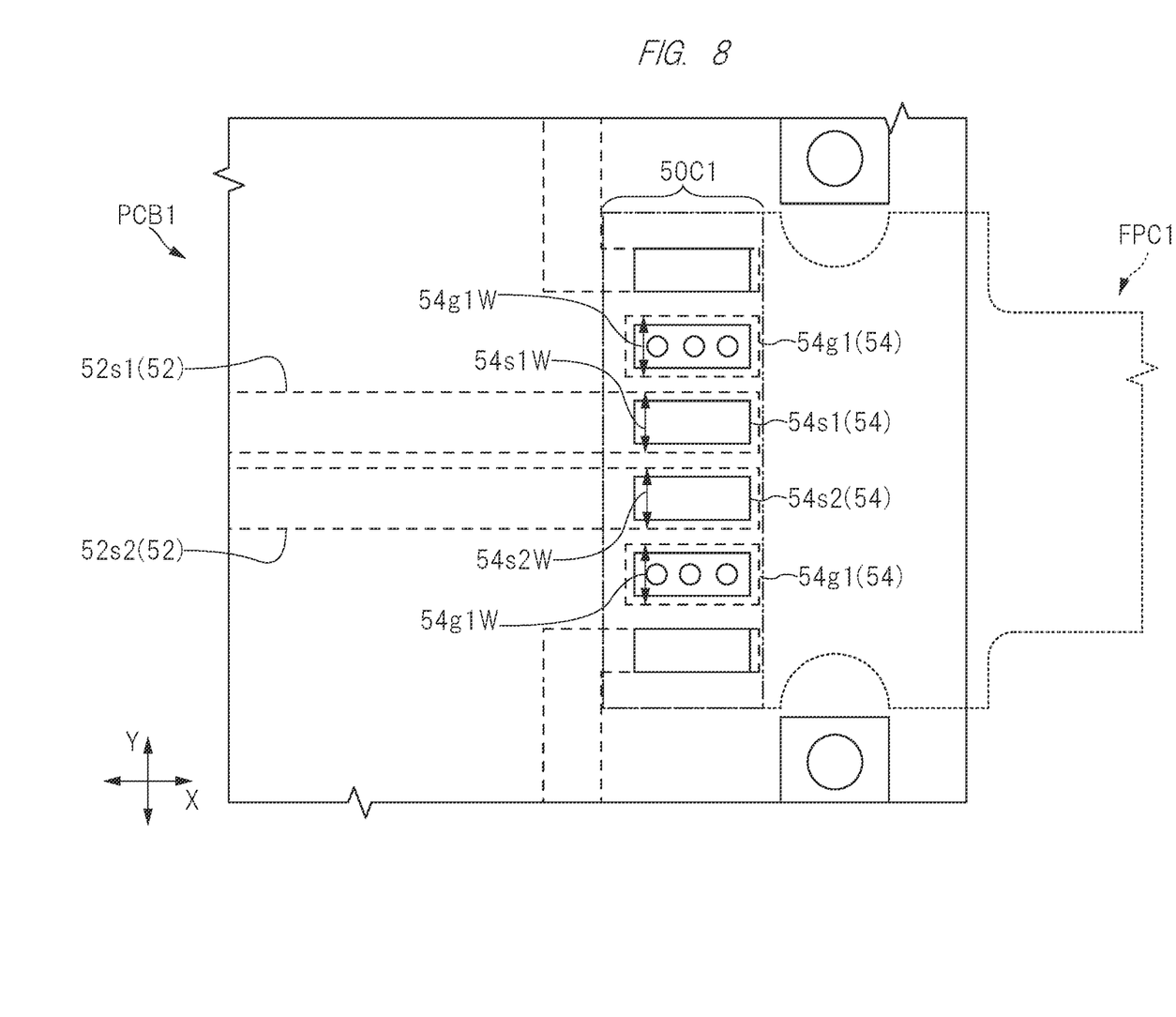
FIG. 8 is an enlarged plan view of a PCB substrate shown in FIG. 5, showing an enlarged periphery of a portion connected to the flexible substrate.

Next, a structural example of the connection portion of the substrate PCB1 shown in FIG. 2 will be described. FIG. 8 is an enlarged plan view of the PCB substrate shown in FIG. 5, showing an enlarged periphery of a portion connected to the flexible substrate. Although each of the signal terminals 54$s$1 and 54$s$2 among the terminals 54 shown in FIG. 8 are formed so as to be integral with a wiring 52, they are distinguished and defined as follows. That is, among the conductor patterns formed on the surface 51A of the core insulating layer 51 and electrically connected to the substrate FPC1, a portion formed at a position facing the connection region 40C1 of the substrate FPC1 is the terminal 54. On the other hand, among the conductor patterns formed on the surface 51A of the core insulating layer 51 and electrically connected to the substrate FPC1, the conductor pattern arranged at a portion not facing the connection region 40C1 (that is, a portion other than a connection region 50C1) is the wiring 52. In the example shown in FIG. 5, a plurality of the wirings 52 is covered by a solder resist film (insulating film) SR2. However, as a modification example, the plurality of wirings 52 may be covered by a protective insulating film similar to each of the protective insulating films (plastic film, insulating film, protective film) PF1, PF2 and PF3.

As shown in FIG. 5, the substrate PCB1 has a core insulating layer 51 having a surface 51A and a surface 51B opposite the surface 51A, the wiring 52 formed on the surface 51A, and a ground plane 53 which is a large-area conductor pattern formed on the surface 51B. The core insulating layer 51 is made of a prepreg material including glass fibers. The core insulating layer 51 is an insulating layer that is more rigid than the core insulating layer 41 of the substrate FPC1 not including glass fibers. The substrate PCB1 has a connection region 50C1 (see FIG. 8) arranged on a portion of the surface 51A and connected to the substrate FPC1. In addition, the substrate PCB1 has a plurality of the terminals 54 formed in the connection region 50C1 and electrically connected to the plurality of wirings 52 or the ground plane 53. The substrate FPC1 has the solder resist film (insulating film) SR2 formed in the connection region 50C1 such that a covering portion of each of the terminals 54 is covered and such that a joint portion of each of the terminals 54 is exposed. The ground plane 53 is covered by the protective insulating film PF3 on the surface 51B of the core insulating layer 51.

As shown in FIG. 8, the plurality of terminals 54 includes the signal terminal 54s1 connected to the signal terminal 44s1 (see FIG. 4), the signal terminal 54s2 connected to the signal terminal 44s2 (see FIG. 4), and a reference potential terminal 54g1 connected to the reference potential terminal 44g1 (see FIG. 4). Each of the wirings 52 has the microstripline structure overlapping the ground plane 53 (see FIG. 5). In addition, each of the signal terminals 54s1 and 54s2 of the substrate PCB1 has the microstripline structure overlapping the ground plane 53.

Thus, in the case of the substrate PCB1, since there is no need to arrange a terminal on the surface 51B side of the core insulating layer 51, the wiring structure of the connection region 50C1 in which the plurality of terminals 54 is arranged can have the microstripline structure. As a result, a decrease in the characteristic impedance for the connection region 50C1 can be suppressed.

Figure 9:
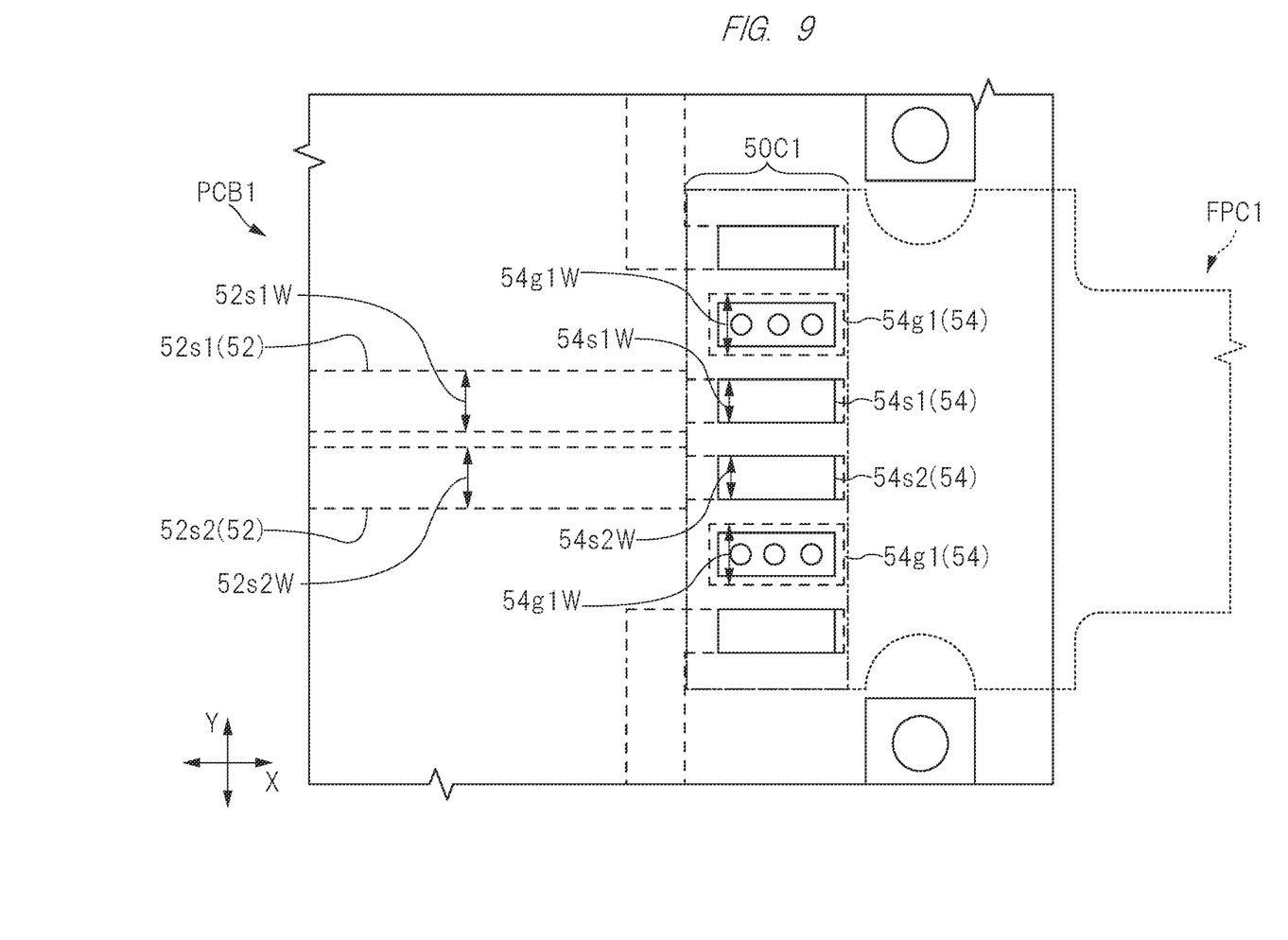
FIG. 9 is an enlarged plan view showing a modification example with respect to FIG. 8.

FIG. 9 is an enlarged plan view showing a modification example with respect to FIG. 8. As described above, studies by the inventors of the present application have found that, in the connection portion between the substrate FPC1 and the substrate PCB1, the value of the characteristic impedance tends to be higher than the design value on the substrate PCB1 side. The modification example shown in FIG. 9 is an example of a method of reducing the characteristic impedance for the connection region 50C1 of the substrate PCB1.

In the example shown in FIG. 8, a width 54s1W of the signal terminal 54s1, a width 54s2W of the signal terminal 54s2, and a width 54g1W of each of the reference potential terminals 54g1 have the same value. On the other hand, in the case of the modification example shown in FIG. 9, each of the width 54s1W of the signal terminal 54s1 and the width 54s2W of the signal terminal 54s2 is smaller than the width 54g1W. In addition, in the example shown in FIG. 9, the width 54s1W of the signal terminal 54s1 is smaller than a width 52s1W of a signal wiring 52s1. Likewise, the width 54s2W of the signal terminal 54s2 is smaller than a width 52s2W of a signal wiring 52s2.

As in the modification example shown in FIG. 9, by making the width of each of the signal terminals 54s1 and 54s2 formed on the substrate PCB1 small, the characteristic impedance for the substrate PCB1 can be brought closer to the design value.

In the foregoing, the invention made by the present inventors has been concretely described based on the embodiment. However, it is needless to say that the present invention is not limited to the foregoing embodiment, and various modifications and alterations can be made within the scope of the present invention.

For example, in the above-described embodiment, the substrate FPC1 comprising the signal terminal 44s2 that forms a differential pair with the signal terminal 44s1 has been described. However, the substrate may comprise a signal terminal that does not form a differential pair with the signal terminal 44s1 and in which another electrical signal (such as a command address signal) flows.

In addition, for example, the number of signal transmission paths is not limited to two, and as a modification example, there may be a case where the substrate is formed of one signal transmission path constituted by the signal terminal 44s1 and the signal wiring 42s1 shown in FIG. 4 and the signal terminal 45s1 shown in FIG. 3, with the signal terminal 44s2 and the signal wiring 42s2 shown in FIG. 4 and the signal terminal 45s2 shown in FIG. 3 removed. In this case, the reference potential wiring 42g1 to which a reference potential is supplied is arranged on both sides of the signal wiring 42s1, and the reference potential terminal 44g1 is arranged on both sides of the signal terminal 44s1.

As another modification example, there may be a case where three or more signal transmission paths are provided.

What is claimed is:

1. An electronic device comprising:
   a first wiring substrate having a flexibility; and
   a second wiring substrate more rigid than the first wiring substrate and electrically connected to the first wiring substrate,
   wherein the first wiring substrate includes:
      a core insulating layer having a first surface and a second surface opposite the first surface, the first surface having a first connection region facing the second wiring substrate, and the second surface having a second connection region overlapping the first connection region;
      a plurality of first wirings formed on the first surface and extending in a first direction;
      a second wiring formed on the second surface and extending in the first direction;
      a plurality of first terminals formed in the first connection region and electrically connected to the plurality of first wirings or the second wiring;
      a plurality of second terminals formed in the second connection region and electrically connected to the plurality of first wirings or the second wiring; and
      an insulating film formed on the first surface of the core insulating layer at a position overlapping each of the first connection region and the second connection region,
   wherein the plurality of first wirings includes:
      a first signal wiring to which an electrical signal is transmitted; and
      a reference potential wiring arranged adjacent to the first signal wiring and to which a reference potential is supplied,
   wherein a reference potential is supplied to the second wiring,
   wherein the plurality of first terminals includes:
      a first signal terminal electrically connected to the first signal wiring; and
      a reference potential terminal arranged adjacent to the first signal terminal and electrically connected to each of the reference potential wiring and the second wiring,
   wherein the plurality of second terminals includes:
      a first backside signal terminal electrically connected to the first signal terminal; and
      a backside reference potential terminal arranged adjacent to the first backside signal terminal and electrically connected to the reference potential terminal,
   wherein the second wiring overlaps the first signal wiring,
   wherein a width of the first signal terminal is larger than a width of the first backside signal terminal, and a width of the reference potential terminal is larger than a width of the backside reference potential terminal, wherein a first separation distance between the first signal terminal and the reference potential terminal is smaller than a second separation distance between the first backside signal terminal and the backside reference potential terminal, wherein the insulating film covers the first connection region such that the second connection region is exposed, wherein the insulating film covering the first connection region covers a peripheral portion of each of the first terminals such that a joint portion of each of the first terminals is exposed, wherein, in a first opening formed in the insulating film, the first signal terminal is electrically connected to the second wiring substrate via a first conductive joint material, and wherein, in a second opening formed in the insulating film, the reference potential terminal is electrically connected to the second wiring substrate via a second conductive joint material electrically separated from the first conductive joint material.

2. The electronic device according to claim 1, further comprising:
 a first semiconductor device mounted on the first wiring substrate; and
 a second semiconductor device mounted on the second wiring substrate,
 wherein the first signal terminal and the first signal wiring are included in a transmission path electrically connecting the first semiconductor device and the second semiconductor device to each other.

3. The electronic device according to claim 1,
 wherein the width of the first signal terminal is larger than a width of the first signal wiring.

4. The electronic device according to claim 1,
 wherein the plurality of first terminals includes a second signal terminal arranged adjacent to the first signal terminal, and in which a signal current that differs from that of the first signal terminal flows,
 wherein the plurality of first wirings includes a second signal wiring connected to the second signal terminal and arranged adjacent to the first signal wiring,
 wherein the second wiring overlaps the second signal wiring,
 wherein the plurality of second terminals includes a second backside signal terminal electrically connected to the second signal terminal,
 wherein, in plan view, a width of the second signal terminal is larger than a width of the second backside signal terminal,
 wherein a third separation distance between the first signal terminal and the second signal terminal is smaller than a fourth separation distance between the first backside signal terminal and the second backside signal terminal, and
 wherein, in a third opening formed in the insulating film, the second signal terminal is electrically connected to the second wiring substrate via a third conductive joint material electrically separated from the first conductive joint material and the second conductive joint material.

5. The electronic device according to claim 1,
 wherein the second wiring substrate includes:
  an insulating layer having a third surface and a fourth surface opposite the third surface;
  a third wiring formed on the third surface and extending in the first direction;
  a ground plane formed on the fourth surface and to which a reference potential is supplied;
  a third connection region arranged on a portion of the third surface and facing the first wiring substrate; and
  a plurality of third terminals formed in the third connection region and electrically connected to the third wiring or the ground plane,
 wherein the plurality of third terminals includes:
  a second substrate signal terminal connected to the first signal terminal; and
  a second substrate reference potential terminal connected to the reference potential terminal, and
 wherein each of the third terminals overlaps the ground plane.

6. The electronic device according to claim 5,
 wherein the width of the first signal terminal is smaller than a width of the third wiring connected to the first signal terminal.

7. The electronic device according to claim 1,
 wherein the first wiring substrate further includes:
  a first protective film formed on the first surface; and
  a second protective film formed on the second surface,
 wherein, among the plurality of first wirings, a portion other than the first connection region is covered by the first protective film, and
 wherein, among the second wiring, a portion other than the second connection region is covered by the second protective film.

8. An electronic device comprising:
 a first wiring substrate having a flexibility; and
 a second wiring substrate more rigid than the first wiring substrate and electrically connected to the first wiring substrate,
 wherein the first wiring substrate includes:
  a core insulating layer having a first surface and a second surface opposite the first surface, the first surface having a first connection region facing the second wiring substrate, and the second surface having a second connection region overlapping the first connection region;
  a plurality of first wirings formed on the first surface and extending in a first direction;
  a second wiring formed on the second surface and extending in the first direction;
  a plurality of first terminals formed in the first connection region and electrically connected to the plurality of first wirings or the second wiring;
  a plurality of second terminals formed in the second connection region and electrically connected to the plurality of first wirings or the second wiring; and
  an insulating film formed on the first surface of the core insulating layer at a position overlapping each of the first connection region and the second connection region,
 wherein the plurality of first wirings includes:
  a first signal wiring to which an electrical signal is transmitted; and
  a second signal wiring arranged adjacent to the first signal terminal and in which an electrical signal that differs from the electrical signal flowing in the first signal terminal flows,
 wherein a reference potential is supplied to the second wiring,
 wherein the plurality of first terminals includes:
  a first signal terminal electrically connected to the first signal wiring; and a second signal terminal arranged adjacent to the first signal terminal and electrically connected to the second signal wiring, wherein the plurality of second terminals includes:

a first backside signal terminal electrically connected to the first signal terminal; and a second backside signal terminal arranged adjacent to the first backside signal terminal and electrically connected to the second signal terminal, wherein the second wiring overlaps each of the first signal wiring and the second signal wiring, wherein a width of the first signal terminal is larger than a width of the first backside signal terminal, and a width of the second signal terminal is larger than a width of the second backside signal terminal, wherein a first separation distance between the first signal terminal and the second signal terminal is smaller than a second separation distance between the first backside signal terminal and the second backside signal terminal, wherein the insulating film covers the first connection region such that the second connection region is exposed, wherein the insulating film covering the first connection region is formed in the first connection region such that a peripheral portion of each of the first terminals is covered and such that a joint portion of each of the first terminals is exposed, wherein, in a first opening formed in the insulating film, the first signal terminal is electrically connected to the second wiring substrate via a first conductive joint material, and wherein, in a second opening formed in the insulating film, the second signal terminal is electrically connected to the second wiring substrate via a second conductive joint material electrically separated from the first conductive joint material.

9. The electronic device according to claim 8, further comprising:

a first semiconductor device mounted on the first wiring substrate; and a second semiconductor device mounted on the second wiring substrate, wherein the first signal terminal and the first signal wiring are included in a transmission path electrically connecting the first semiconductor device and the second semiconductor device to each other.

10. The electronic device according to claim 8, wherein the width of the first signal terminal is larger than a width of the first signal wiring.

11. The electronic device according to claim 8, wherein the first wiring substrate further includes:

a first protective film formed on the first surface; and a second protective film formed on the second surface, wherein, among the plurality of first wirings, a portion other than the first connection region is covered by the first protective film, and wherein, among the second wiring, a portion other than the second connection region is covered by the second protective film.

* * * * *